United States Patent [19]
Millben

[11] 3,946,254
[45] Mar. 23, 1976

[54] NO-BOUNCE ELECTRONICALLY CONTROLLED SWITCH CIRCUIT

[75] Inventor: Lawrence A. Millben, Detroit, Mich.

[73] Assignee: Burroughs Corporation, Detroit, Mich.

[22] Filed: Aug. 2, 1974

[21] Appl. No.: 494,318

[52] U.S. Cl. ............ 307/268; 307/247 A; 307/254; 328/87

[51] Int. Cl.² .......................................... H03K 17/00

[58] Field of Search ............ 307/247 R, 247 A, 9 C, 307/292; 340/365 C; 328/87, 63, 196, 206

[56] References Cited

UNITED STATES PATENTS

| | | | |
|---|---|---|---|
| 3,247,399 | 4/1966 | Moody | 307/247 R |
| 3,471,789 | 10/1969 | Nutting et al. | 328/63 |
| 3,508,079 | 4/1970 | Moll et al. | 307/218 |
| 3,553,497 | 1/1971 | Smith | 307/292 |
| 3,593,036 | 7/1971 | Ma | 307/247 A |
| 3,624,518 | 11/1971 | Dildy, Jr. | 307/247 A |
| 3,725,680 | 4/1973 | Silva | 307/247 A |

*Primary Examiner*—Stanley D. Miller, Jr.
*Assistant Examiner*—R. P. Davis
*Attorney, Agent, or Firm*—Leon E. Redman; Edwin W. Uren

[57] ABSTRACT

An electronically controlled switch circuit for providing a single noise-free output pulse from the output of a modified master-slave flip flop circuit in response to an input signal alternately applied to set and clock pulse inputs from the output of a single pole double throw switch coupled therebetween.

10 Claims, 2 Drawing Figures

NO-BOUNCE ELECTRONICALLY CONTROLLED SWITCH CIRCUIT

BACKGROUND OF THE INVENTION

The invention relates to an electronically controlled switch circuit and more particularly a switch electronically controlled to produce a noise-free single pulse output of a particular predetermined polarity irrespective of switch input noise resulting from switch contact bounce or line noise.

Noise-free single pulse outputs of indefinite duration and a particular predetermined polarity are often required for testing electronic digital computer devices such as high speed memories and shift registers. Noise-free single pulse outputs of a particular predetermined polarity may also be employed as power on pulses to establish logic circuits in a known state.

PRIOR ART

In the prior art, single pole double throw switches or push buttons have been employed in conjunction with various electronic circuits for producing a single pulse output. While these switches have gained widespread acceptance in the computer industry for numerous applications, they have not been generally employed in applications that require an extremely high degree of reliability such as noise-free single pulse output. This is due to the major drawback of these switches, which is the phenomenon entitled contact bounce. When such a switch is operated, its contacts forcibly strike each other and initially only make intermittent contact until they ultimately stop bouncing. This bouncing, which may have both high and low frequency noise components, results in ambiguous or spurious output pulses which are not acceptable for applications requiring noise-free single pulse output signals with a high degree of reliability.

Prior art circuits for controlling low frequency contact bounce typically employ delay multi-vibrator devices. A delay multivibrator is chosen to provide a delay sufficient to span the period of time required for the switch contacts to stop bouncing and provide a reliable signal during the time delay. Such time delays make these circuits undesirable for high speed digital circuit applications. Furthermore, if the contacts continue to bounce after the time delay has timed out, the circuit's output becomes ambiguous.

Another prior art circuit which has been employed in attempting to control contact bounce while producing a single pulse output is a circuit employing cross-coupled gates. Such circuits, however, have an inherent ambiguity between the upper and lower threshold voltages to which the gates respond.

A further prior art approach to the problems caused by contact bounce is to couple the outputs of a single pole double throw switch directly to the base of cross-coupled transistors of a bistable flip flop circuit. When the switch is in one position, an output is obtained at one flip flop output and when switched to the other position, the flip flop state changes, providing an output at the other flip flop output. Such an antibounce switch circuit may be effective in controlling low frequency type contact bounce. It is not sufficiently reliable to insure that high frequency contact bounce would not be passed on to the flip flop output. Since transistor turn-on time is much faster than turn-off time, high frequency bounce may be passed to the output of a transistor being turned on before the other transistor turns off to latch the circuit.

Such prior art circuits for controlling contact bounce usually fail and produce spurious output pulses when the input noise due to the contact bounce approaches a high frequency of approximately three megacycles.

A yet further prior art approach to the problems of contact bounce and line noise employ a RS flip flop, a NOR gate, an inverter, and a trigger flip flop interconnected to provide a noise-free signal at the output of the trigger flip flop in response to actuation of a manually operated switch. While such a circuit arrangement may provide high immunity for both the high frequency and low frequency components of contact bounce and line noise it does not produce an output signal of a particular predetermined polarity. Rather, the polarity of the output pulse depends upon the previous state of the trigger flip flop which is usually unknown.

Furthermore, such a circuit is expensive to implement in that an outside source of clock pulses must be provided to change the state of the RS flip flop. Besides, such a circuit proves cumbersome to use in testing digital logic circuits in that two actuations or four movements of a switch must take place in order to produce a single pulse output.

Other prior art arrangements which address the problems of contact bounce are known. For example, U.S. Pat. No. 3,471,789 to D. W. Nutting et al, and U.S Pat. No. 3,508,079 to E. W. Moll et al, of common ownership herewith, provide a noise-free single output pulse at the output of either SR or SC flip flops in response to the actuation of a single pole double throw switch or push button. However, both of these circuits require an outside source of clock pulse signals, making them expensive to implement.

SUMMARY OF THE INVENTION

It is therefore an object of the present invention to provide an unambiguous noise-free output pulse in response to the actuation of a mechanical switch irrespective of switch contact bounce with a high degree of reliability.

It is a further object of this invention to provide a noise-free output pulse of a particular predetermined polarity, irrespective of high or low frequency contact bounce.

It is still a further object of the present invention to provide an inexpensive circuit that accomplishes the above objects, which is also inexpensive to implement.

It is an additional object of this invention to obviate the problems and expense of providing an outside source of clock pulse signals.

It is yet a further object of this invention to provide a single pulse noise-free output pulse with a minimum number of electronic devices and external wiring.

In accordance with the present invention, an electronically controlled switch circuit has been provided in which an input signal is received from a first switch output for setting the output state of the switch circuit to a particular predetermined polarity which is reversed upon alternating the switch input to a second switch output received by the circuit for enabling the switch circuit output states to be reversed in response to the operation of the switch.

BRIEF DESCRIPTION OF THE DRAWING

These and other objects, advantages and features of the invention will be more clearly understood from the following detailed description, appended claims and accompanying drawing in which:

DETAILED DESCRIPTION OF THE PREFERRED EMBODIMENT

Figure 1:
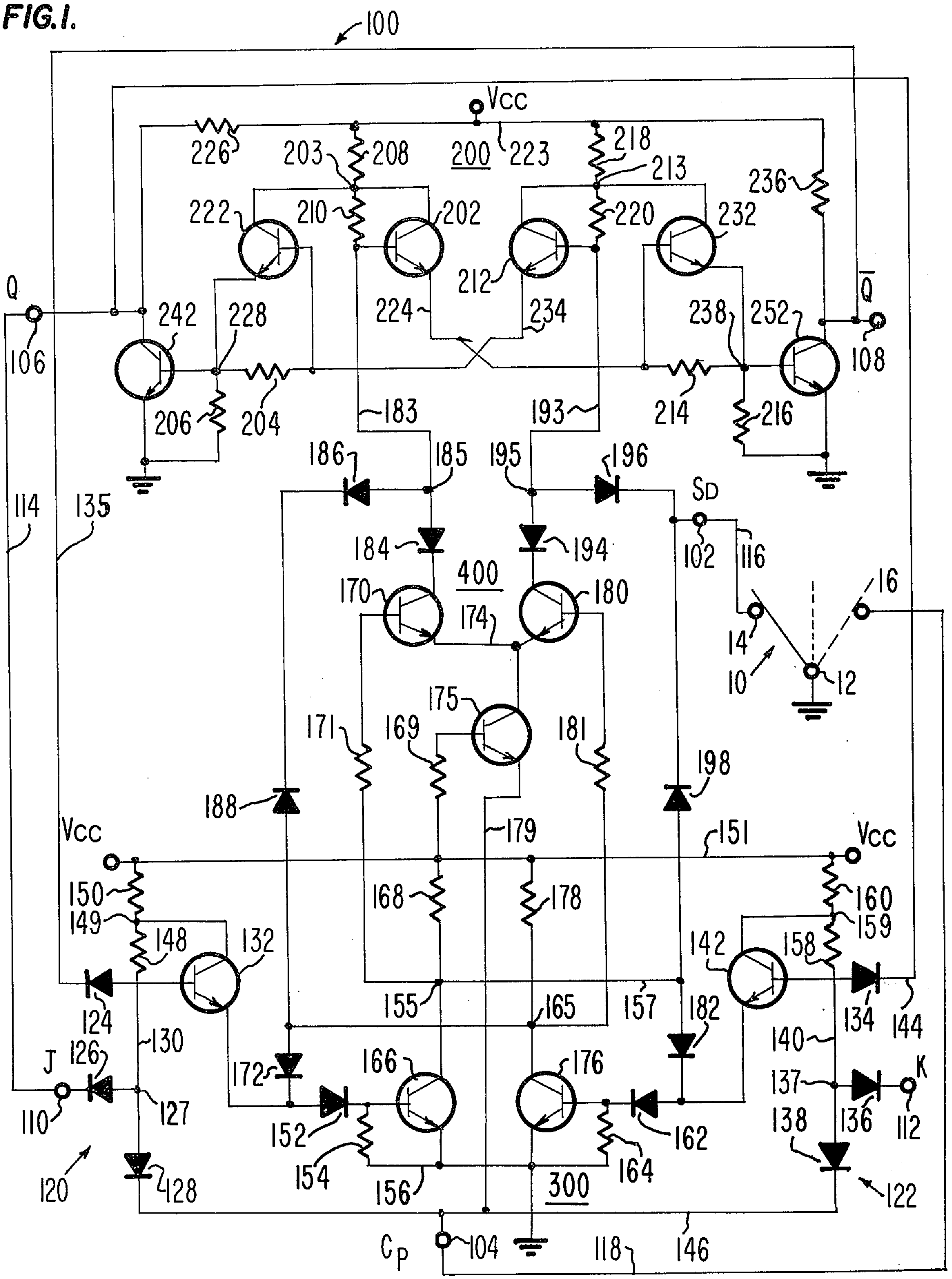
FIG. 1 is an electrical schematic of a modified master-slave flip flop circuit coupled with a single pole double throw switch of the present invention.

Referring to FIG. 1, a single pulse output electronically controlled switch is provided by connecting a single pole double throw switch or push button 10 with a modified master-slave flip flop 100.

In the preferred embodiment (FIG. 1) the master-slave flip flop 100 comprises a DTL integrated circuit including a master flip flop 300 and a slave flip flop 200 coupled together by a coupling circuit 400 which is in turn enabled by a current steering circuit. Such IC devices are readily available commercially at low cost. Typically, two such devices are provided on a single chip in a unitary package.

The input to the master-slave flip flop comprises a set terminal 102 and a clock pulse terminal 104. The outputs of the flip flop 100 are provided on the output of the slave portion 200 of the circuit and are designated Q and $\bar{Q}$.

In the present invention a jumper conductor 114 is employed to short the Q output 106 of the slave 200 with the J input 110 of the master portion 300 of the circuit. A single pole double throw switch 10, hereinafter designated SPDT, has one contact 14 coupled to the SD set terminal 102 of the flip flop 100 through a conductor 116. In the preferred embodiment the contact 14 connected to the SD set input 102 is the normally closed contact of the SPDT. The other contact 16 of the SPDT switch 10 is connected to the $C_p$ clock pulse terminal 104 by a conductor 118. The center pole contact 12 of the SPDT switch 10 is connected to a reference potential such as ground.

The master portion 300 of the circuit includes at its J input 110 a first AND gate 120 and at its K input 112 a second AND gate 122.

The J input AND gate 120 includes three diodes 124, 126, 128 having their anodes connected to a common conductor 130 feeding an emitter follower AND gate transistor 132. One diode 124 has its cathode connected to the Q slave output 108 by a conductor 135. A second diode 126 has its cathode connected through a conductor 114 with the $\bar{Q}$ slave output 106. The third AND gate diode 128 has its cathode connected to the $C_p$ clock pulse terminal 104.

The K input 112 of the master 300 portion of the flip flop similarly includes three AND gate diodes 134, 136, 138 having their anodes connected to a common conductor 140 feeding the omitter-follower AND gate transistor 142. One of the k input AND gate diodes 134 has its cathode connected by a conductor 144 to the Q slave output 106. A second K input AND gate diode 136 has its cathode unconnected and this diode is not employed in the present circuit. The third K input AND gate diode 138 has its cathode connected to the $C_p$ clock pulse terminal 104 by a conductor 146. The bases of each of the AND gate transistors 132, 142 may be connected through respective series connected resistors 148, 150 and 158, 160 through a common conductor 151 to a supply terminal $V_{cc}$ providing positive DC voltage. In order to keep the AND gate transistors 132, 142 from saturating while they are conducting, their collectors are coupled to the junctions 149, 159 between the respective series connected resistors 148, 150 and 158, 160. The output of each of the AND gate transistors 132, 142 is provided across respective resistors 154, 164 which are each connected in series with a respective diode 152, 162 between the AND gate transistor emitters and ground through a conductor 156.

The master portion 300 of the flip flop circuit further includes a pair of flip flop transistors 166, 176. The base of each of these flip flop transistors 166, 176 is fed from the output of its associated AND gate 120, 122. Both of the flip flop transistors 166, 176 have their emitters connected to ground through conductor 156 and their collectors connected to the $V_{cc}$ supply terminal through their respective load resistors 168, 178 and conductor 151. The collectors of the master flip flop transistors 166, 176 are also connected to the bases of coupling transistors 170, 180 through their respective load resistors 171, 181.

The master flip flop transistors 166, 176 are cross-coupled so that when one of these transistors 166, 176 is non-conducting, the other will tend to be conducting. The collector output of the master flip flop transistor 166 on the J side of the master portion 300 is connected to the base of the K side master flip flop transistor 176 through a pair of series connected diodes 182, 162. Thus, whenever the collector output at junction 155 rises, base current is supplied to the base of transistor 176 maintaining it in an on condition regardless of the K AND gate 122 output.

Similarly, the collector output of the flip flop transistor 176 on the K side is fed back to the base of the J side flip flop transistor 166 through a pair of series connected diodes 172, 152.

The slave portion 200 of the flip flop includes a pair of slave flip flop transistors 202, 212 whose bases are respectively fed by the output from the coupling transistors 170, 180 whose bases are in turn fed by the output of the collector of the master flip flop transistors 166, 176. The emitters of the coupling transistors 170, 180 are connected in common to a conductor 174 which is coupled to the clock pulse terminal 104 through a current steering circuit.

The base of slave flip flop transistor 212 is also coupled to the SD set input through conductor 193 and diode 196.

In the preferred embodiment, the current steering circuit comprises a current steering transistor 175 whose emitter is connected through a conductor 179 to the $C_p$ clock pulse terminal 104, and its collector is connected to the common conductor 174 between the emitters of the coupling transistors 170, 180. The base of the current steering transistor 175 is connected through a resistor 169 and conductor 151 to the $V_{cc}$ supply terminal.

The collector outputs of the coupling transistors 170, 180 are fed, through diode 184 and diode 194 respectively, to the bases of the slave flip flop transistors 202, 212. The emitters of the slave flip flop transistors 202, 212 are connected to ground through respective pairs of series resistors 204, 206 and 214, 216. The collectors of the slave flip flop transistors 202, 212 are connected to the $V_{cc}$ supply terminal through respective resistors 208, 218. The collector outputs of the slave flip flop transistors 202, 212 are also fed to associated dual transistor current shunt circuits.

Each current shunt circuit comprises a pair of current shunt transistors 222, 242 and 232, 252 which provide a current path to ground, when conducting, from the collector output of the slave flip flop transistors 202, 212. When a pair of current shunt transistors associated with one of the slave flip flops is on, current which would otherwise flow to the base of that associated slave flip flop transistor from terminal $V_{cc}$ through the conductor 223 and series connected resistors 208, 210 or 218, 220 is starved.

Current shunt transistors 222, 232 have their collectors coupled with the collectors of their associated slave flip flop transistors 202, 212. The base of each of the current shunt transistors 222, 232 is connected through a conductor 234, 224 to the emitters of respective slave flip flop transistors 212, 202. Therefore, even if a high voltage is seen at junction 195, slave flip flop transistor 212 cannot turn on until shunt transistor 232 turns off.

Current shunt transistors 242, 252 serve a dual purpose by also providing the slave output. These output transistors 242, 252 have their collectors coupled to the $V_{cc}$ terminal through resistors 226 and 236. Their bases are connected to the emitter of the current shunt transistors 222, 232 at junctions 228, 238 through resistors 204 and 214. The emitter of the output transistors 242, 252 is connected to ground.

CIRCUIT OPERATION

Figure 2:
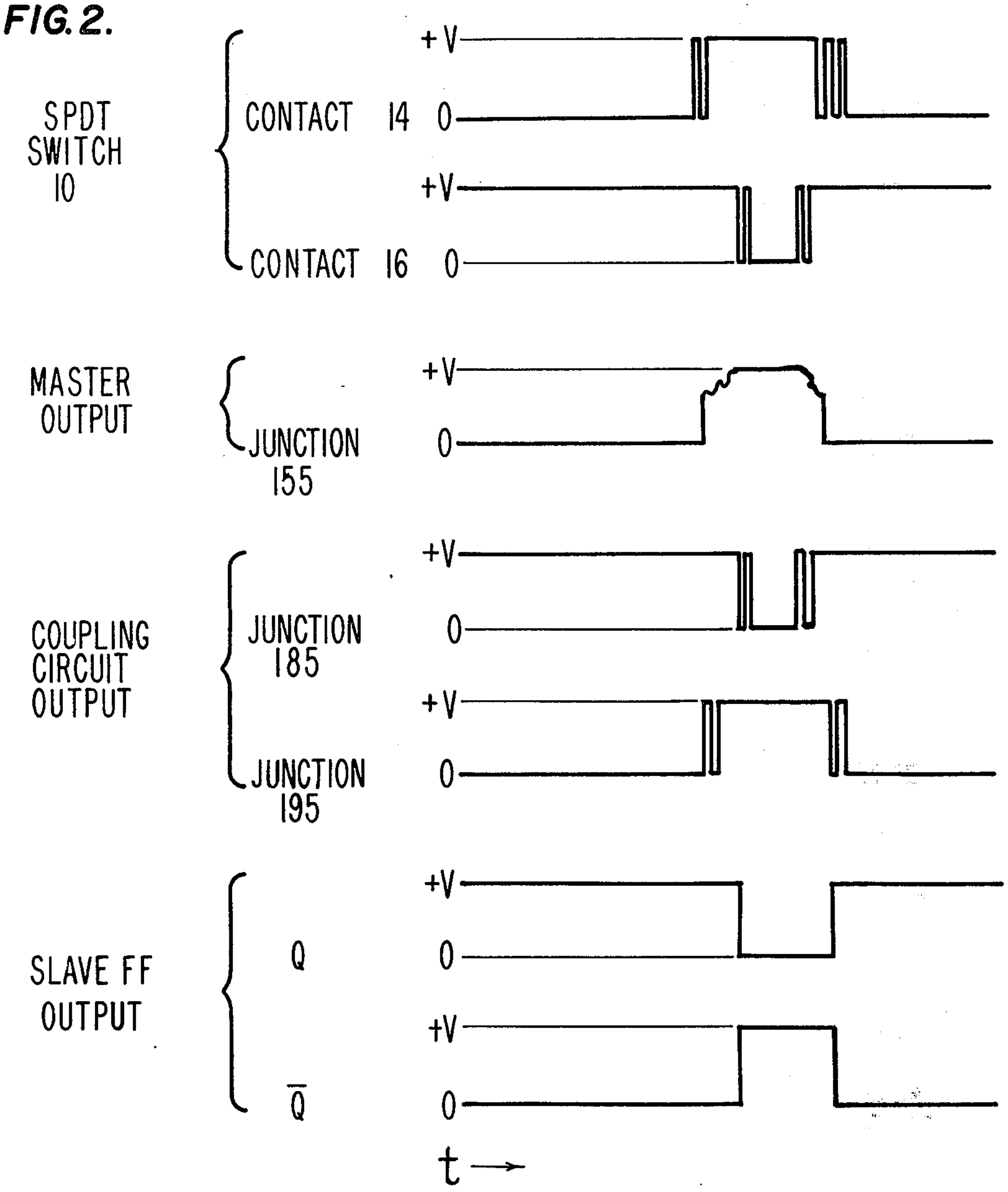
FIG. 2 is a timing diagram illustrating the voltage waveforms at selected points in the circuit as shown in FIG. 1.

For a more complete understanding of the present invention, a detailed description of the operation of the single pulse electronically controlled switch follows with reference to FIGS. 1 and 2.

As previously stated, SPDT switch contacts 12 and 14 may be shorted together in a quiescent state applying a ground to the SD set input 102 of the masterslave flip flop 100. Applying the ground to the SD set input 102 results in substantially a ground condition at the junction 195 between diodes 194 and 196. The voltage at junction 195 is at near ground rather than ground due to the slight voltage drop across diode 196. The near ground at junction 195 is applied to the base of the slave flip flop transistor 212 via conductor 193. This turns the slave flip flop transistor 212 off.

Turning transistor 212 off starves current from the base of the current shunt transistor 222 which is thereby also turned off. The resistor 206 connected between the base and the grounded emitter of slave Q output transistor 242 provides substantially a ground at the base of that transistor since no base current is available. Thus, the Q output transistor 242 is turned off with its collector output therefore high. This high Q output signal is fed to the base of the K input AND gate transistor 142 through conductor 144 and diode 134.

Since a ground or low is applied to the base of current shunt transistor 222, it will be rendered nonconducting. Therefore, when current shunt transistor 222 turns off, current will flow from the supply terminal $V_{cc}$ through the conductor 223, resistor 208, through junction 203, and through resistor 210 to the base of the slave flip flop transistor 202. Then transistor 202 is turned on and conducts base current through the emitter to the base of current shunt transistor 232. Thus, current shunt transistor 232 is turned on. Current is thereby conducted from $V_{cc}$ through resistor 218, through junction 213 to the conducting current shunt transistor 232 and in turn to the base of $\bar{Q}$ output transistor 252. With transistor 252 conducting, a low is seen at its collector output and the $\bar{Q}$ output of the flip flop.

With the slave portion 200 of the flip flop in the above-described initial condition with a ground applied to the SD set input 102 by virtue of the SPDT switch contacts 14 and 12 shorted together, the master portion 300 of the flip flop assumes the following initial state.

The output at the collector of the master flip flop transistor 166 at junction 155 is held at substantially ground while being shunted through conductor 157, diode 198, and through shorted contacts 14, 12 of the SPDT switch 10. Therefore, even with transistor 166 in an off condition, tending to make its collector output high, it will still have a low collector output at junction 155.

In the initial state the input to the $C_p$ clock pulse terminal 104 is a high signal with contacts 12 and 16 of the SPDT switch 10 open. The clock signal being high, back biases the two clock diodes 128 and 138. A high is thereby provided at junctions 127 and 137 on the J and K sides respectively, of the master flip flop 300.

The slave portion 200 of the circuit will feed its $\bar{Q}$ output at 108 through conductor 135 and diode 124, and its Q output at 106 through conductor 144 and diode 134. Therefore, diode 124 will assume the state of the $\bar{Q}$ output 108 of the slave portion of the circuit which is the collector output of slave output transistor 252. Likewise, diode 134 will assume the state of the Q output 106 of the slave portion of the circuit, which corresponds to the collector output of slave output transistor 242.

Since the $\bar{Q}$ output is low in the initial state, then diode 124 is low, which removes the base current from the resistor 148 connected between the base and collector of AND gate transistor 132. This turns AND gate transistor 132 off, which in turn turns off master flip flop transistor 166.

Although the collector output of transistor 166 is high, junction 155 will still not go high due to its being shunted by the diode 198 connected between the conductor 157 and the SD set input 102 of the flip flop through the SPDT switch 10 to ground.

Diode 134 will be high since the Q output 106 of the slave portion of the flip flop at the collector output of output transistor 242 is high in the initial state. Both diodes 134 and 138 of AND gate 122 are then high. Base current is thus fed to the base of AND gate transistor 142, turning it on and in turn supplying base current to the base of master flip flop transistor 176. With transistor 176 conducting, a low is seen at its collector output at junction 165.

Thus, a low is seen at both junctions 155 and 165. Again, junction 155, although it would normally be high since master flip flop transistor 166 is off, is low due to the shunt to ground through diode 198 and the SPDT switch 10.

Coupling transistors 170 and 180 are both off in this initial state due to the low output provided at junctions 155 and 165.

As soon as the SPDT switch 10 breaks the connection between contact 14 and contact 12 and enters the flight condition, the ground is removed from the SD set input 102 thereby allowing the collector output of the master flip flop transistor 166 to go high at junction 155 by removing the shunt to ground. As the collector output at junction 155 of the master flip flop transistor 166 begins to rise with removal of shunt to ground, then base current is fed to master flip flop transistor 176 via diodes 182 and 162. Thus master flip flop transistor 176 remains in the on condition irrespective of the output of K AND gate 122.

A high is applied to the base of the current steering transistor 175 by resistor 169 coupled to the $V_{cc}$ supply voltage via conductor 151. The current steering transistor 175, however, remains in an off condition due to the high still appearing at the $C_p$ clock input terminal 104 which is connected to the emitter of current steering transistor 175 by conductor 179. Even though a high is fed to the base of coupling transistor 170 through resistor 171 from junction 155, it will remain off due to the high at its emitter via conductor 174 resulting from current steering transistor 175 being off.

Since a low appears at the collector output of master flip flop transistor 176 at junction 165, which is connected to the base of coupling transistor 180 through a resistor 181, coupling transistor 180 remains off. Therefore, both coupling transistors 170 and 180 are nonconducting. In this state the coupling transistors and the master portion 300 have no effect on the state of the slave portion 200 or the output of the flip flop 100 during switch flight.

The flight condition is terminated upon initial contact by the SPDT switch 10 with contacts 12 and 16. Then a ground signal is applied to the $C_p$ clock pulse terminal 104. This ground signal initiates the operation of the current steering mechanism by applying a ground to the emitter of current steering transistor 175. The current steering transistor 175 then conducts, due to the high signal appearing at its base from junction 155 resulting in a near ground condition at the common emitters of the coupling transistors 170 and 180. With the emitter of coupling transistors 180 now at a ground and its base already at ground, it will remain off.

On the other hand, coupling transistor 170, with a ground now at its emitter and a high signal appearing at its base, will conduct current. Thus, as coupling transistor 170 turns on, a ground is seen at junction 185 which is in turn applied to the base of slave flip flop transistor 202 through conductor 183, turning transistor 202 off. Turning transistor 202 off, terminates the current flow from its emitter to the base of the current shunt transistor 232. As transistor 232 is thus turned off, current ceases to flow from its emitter to the base of output transistor 252. This results in a high signal at the $\bar{Q}$ output 108 of the slave portion of the flip flop from the high collector output of transistor 252.

Since current is no longer shunted away from the base of slave flip flop transistor 212, with shunt transistor 232 off, transistor 212 is latched on due to the high signal applied to its base from the $V_{cc}$ supply via conductor 223 and resistors 218 and 220 along with the high at junction 213 from the high collector output of transistor 232. Slave flip flop transistor 212, thus positively latched on, conducts emitter current to the base of current shunt transistor 222, turning it on, and in turn causing it to conduct current to the base of slave output transistor 242. With output transistor 242 conducting, it has a low collector output resulting in a low signal at the Q output 106 of the slave portion of the flip flop.

Thus, the state of the slave flip flop 200 is reversed from its predetermined initial state in a positive unambiguous manner. A single noise-free output pulse of a known polarity may be taken from either the Q or $\bar{Q}$ output.

Referring now to the master portion 300 of the circuit, when the Q output from the slave output transistor 242 goes low, a low is applied to the J input 110 of the master portion of the circuit through conductor 106. Diode 126 thus goes low and starves current from the base of the AND gate transistor 132, keeping it off. This prevents current from flowing to the base of master flip flop transistor 166. Thus, master flip flop transistor 166 is kept off, thereby maintaining the high collector output already seen at junction 155.

The low at the Q output 106 of the slave portion 200 of the circuit is also fed back to the K side of the master portion 300 of the circuit through conductor 144 to diode 134. Thus, as the output from AND gate diode 134 and junction 137 goes low, base current to AND gate transistor 142 is starved, turning it off. However, this does not turn off master flip flop transistor 176 because, as previously explained, current flows to the base of master flip flop transistor 176 from the high voltage at junction 155 via conductor 157 and diodes 182 and 162 maintaining transistor 176 latched in the on position.

All succeeding bounce or noise signals will be ignored until the SPDT switch is returned to contact 14.

Returning the SPDT switch 10 to contact 14 will return the master-slave flip flop 100 to its intital state, as previously described. This enables the SPDT switch 10 to output another single noise-free pulse upon subsequent switching to contact 16.

What is claimed is:

1. A circuit for producing a single noise-free output pulse of a predetermined logic state in response to actuation of bi-positionable switch means for alternately supplying an electrical reference signal from one switch position to the other switch position, comprising:

a first flip-flop including input means, output means, and means responsive to the electrical reference signal supplied to the one position of said bi-positionable switch means for setting the logic state of said first flip-flop output means to a predetermined logic state;

a second flip-flop including output means coupled to said first flip-flop logic state setting means for maintaining a first predetermined logic state at said second flip-flop output means only while said bi-positionable switch means remains at said one switch position and input means responsive to the predetermined logic state of said first flip-flop output means for establishing a second predetermined logic state at said second flip-flop output means during actuation of said bi-positionable switch means toward the other switch position;

means for coupling said second flip-flop output means with said first flip-flop input means for reversing the set predetermined logic state of the first flip-flop output means in response to the established second predetermined logic state at said second flip-flop output means only upon arrival of said bi-positionable switch means at said other switch position; and means for preventing said second flip-flop from reversing said established second predetermined logic state at said second flip-flop output means to said first maintained predetermined logic state while said first flip-flop output means is in said set predetermined logic state.

2. The circuit of claim 1 wherein said preventing means comprises gate means for coupling said first flip flop output means with said second flip flop input means.

3. The circuit of claim 2 wherein said gate means comprises means for connecting to said other position of said bi-positionable switch.

4. An electronically controlled switch for producing a noise-free output pulse of a predetermined logic state, comprising:

an input master flip-flop circuit including a master flip-flop output;

a slave flip-flop circuit including two slave flip-flop outputs having two oppositely oriented output states;

a current steering circuit;

a coupling circuit responsive to the master flip-flop output and said current steering circuit for coupling the output of said input master flip-flop circuit with said slave flip-flop circuit for reversing said oppositely oriented output states; and a switch having one input connected to an electrical reference, two switch outputs and means for alternately supplying said electrical reference from said switch input to one of said two switch outputs, one of said switch outputs connected to said slave flip-flop circuit for establishing predetermined oppositely oriented logic states at said two slave flip-flop outputs in response to said electrical reference being supplied to said one switch output, and said one switch output also coupled to said master flip-flop output of maintaining said master flip-flop output substantially at said electrical reference only while said electrical reference is supplied to said one switch output thereby disabling said coupling and current steering circuits, the other switch output coupled to said current steering circuit for enabling said coupling circuit to couple said master flip-flop output with said slave flip-flop circuit for reversing the established oppositely oriented states of said two slave flip-flop outputs in response to supplying said electrical reference to said other switch output.

5. The circuit of claim 1 wherein said coupling means comprises a current steering circuit, and a coupling circuit responsive to said second flip-flop output means and said current steering circuit.

6. The curcuit of claim 5 wherein said coupling circuit comprises common emitter transistor circuit means disposed between said first flip-flop input means and said second flip-flop output means.

7. The circuit of claim 6 wherein said current steering circuit comprises transistor means disposed between said common emitter transistor circuit means and said other position of said bi-positionable switch.

8. The circuit of claim 1 wherein said electrical reference signal is electrical ground.

9. The electronically controlled switch of claim 4 further comprising means for preventing said master flip-flop output from changing logic state while said slave flip-flop outputs are in said reversed states.

10. The electronically controlled switch of claim 9 wherein said electrical reference is electrical ground.

* * * * *

UNITED STATES PATENT OFFICE

CERTIFICATE OF CORRECTION

Patent No. 3,946,254 Dated March 23, 1976

Inventor(s) Lawrence A. Millben

It is certified that error appears in the above-identified patent and that said Letters Patent are hereby corrected as shown below:

Col. 1, line 44, should read "reliable output signal".

Col. 3, line 49, should read "to the $\bar{Q}$ slave".
line 51, should read "the Q slave".
Col. 4, line 48, should read "set input 102 through".

Signed and Sealed this

*eighth* Day of *June 1976*

[SEAL]

*Attest:*

RUTH C. MASON
*Attesting Officer*

C. MARSHALL DANN
*Commissioner of Patents and Trademarks*